United States Patent
Griffiths et al.

(10) Patent No.: US 7,557,926 B2
(45) Date of Patent: Jul. 7, 2009

(54) APPARATUS FOR MEASURING SEMICONDUCTOR PHYSICAL CHARACTERISTICS

(75) Inventors: Carl Griffiths, Llanfechain (GB); Stuart James Curzon Irvine, Bethesda (GB); Andrew Stafford, Gyffin (GB)

(73) Assignee: Optical Reference Systems Limited, St. Asaph (GB)

( * ) Notice: Subject to any disclaimer, the term of this patent is extended or adjusted under 35 U.S.C. 154(b) by 37 days.

(21) Appl. No.: 11/747,628

(22) Filed: May 11, 2007

(65) Prior Publication Data

US 2008/0036997 A1 Feb. 14, 2008

(30) Foreign Application Priority Data

May 13, 2006 (GB) .................................. 0609545.9

(51) Int. Cl.
*G01N 21/55* (2006.01)
(52) U.S. Cl. ..................... 356/445; 356/72; 356/73; 356/319
(58) Field of Classification Search ............ 356/72–73, 356/364–369, 314, 317–319, 326, 445; 204/192.13, 204/298.03; 247/9, 255.5; 250/423 P, 492.21, 250/252.1; 118/722, 726; 136/251, 256, 136/246
See application file for complete search history.

(56) References Cited

U.S. PATENT DOCUMENTS

| 5,835,221 | A | * | 11/1998 | Lee et al. ..................... 356/369 |
| 5,956,148 | A | * | 9/1999 | Celii ............................ 356/369 |
| 6,140,570 | A | * | 10/2000 | Kariya ....................... 136/256 |
| 6,419,802 | B1 | | 7/2002 | Baldwin |
| 6,454,862 | B1 | * | 9/2002 | Yoshida et al. ............... 118/722 |
| 6,617,574 | B2 | * | 9/2003 | Kelson et al. ............. 250/252.1 |
| 6,781,692 | B1 | * | 8/2004 | Rosencwaig ................ 356/369 |
| 7,159,599 | B2 | * | 1/2007 | Verhaverbeke et al. ....... 134/109 |

FOREIGN PATENT DOCUMENTS

| DE | 3234534 | 5/1984 |
| EP | 1170396 | 1/2002 |
| JP | 63215591 | 9/1988 |
| JP | 10265954 | 10/1998 |
| WO | WO2006089752 | 8/2006 |

OTHER PUBLICATIONS

European Search Report for Application No. EP07251971; Jul. 25, 2007, pp. 3.
United Kingdom Search Report for Application No. GB0609545.9; Aug. 31, 2006, pp. 1.

\* cited by examiner

*Primary Examiner*—Sang Nguyen
(74) *Attorney, Agent, or Firm*—Reising Ethington P.C.

(57) ABSTRACT

A reflectometry method and apparatus for gathering meaningful reflectance data indicative of one or more characteristics of a substance being grown on a horizontal substrate within a reaction chamber. The apparatus includes an external light source which shines light into the chamber through an opening having a shutter for selectively permitting or preventing the light from passing in and out of the chamber through the opening. A detector receives light that reflects off the substance and exits the chamber through the opening. During operation, the substrate is rotated about an axis substantially normal to the growing plane within the reaction chamber to ensure uniform deposition of the substance thereon. The shutter momentarily opens in synchronicity with the speed of revolution of the substrate such that substantially the same discrete area of the growing substance is illuminated so as to eliminate the effects of precession on the measurements.

10 Claims, 5 Drawing Sheets

US 7,557,926 B2

APPARATUS FOR MEASURING SEMICONDUCTOR PHYSICAL CHARACTERISTICS

TECHNICAL FIELD

This invention is concerned with a method and apparatus for measuring semiconductor physical characteristics as such are grown in the typically aggressive environments of reaction chambers. More specifically, the invention concerns the control of growth reaction parameters such as temperature, pressure, volumetric flow rates, wafer rotation speeds and the like which can have a material affect on the resulting semiconductor wafer.

BACKGROUND

Reflectometry is the known art of analysing a beam of light reflected from a semiconductor wafer surface to determine certain physical characteristics of that seminconductor, e.g. refractive index, thickness, chemical composition, surface roughness and much reflectance data for a variety of different semiconductor materials already exists. Pyromtery is a similar technique, except that the parameter analysed is the thermal radiation emitted from the semiconductor wafer as it is being grown within a reaction chamber. The term "in-situ" is thus commonly applied to these techniques to indicate that the processes occur as the semiconductor is being grown.

Although the following description is generally concerned with reflectometry, the reader should understand that the invention has application in the fields of both reflectometry and pyrometry.

Although the invention is mostly concerned with the improvement of in-situ reflectometry techniques as they are applied to the measurement of Ga—N and Ga—Al—N semiconductor materials which have recently been more widely adopted in the semiconductor industry, those skilled in the art will appreciate that this invention is not restricted to such semiconductor materials, and indeed may have application to traditional and more modern semiconductor materials. Moreover, from the following, it will be appreciated that the invention may improve in-situ reflectometry for any material which may be grown using any of a number of deposition techniques, such as Chemical Vapour Deposition (CVD), Metal Organic Vapour Phase Epitaxy (MOVPE), Molecular Beam Epitaxy (MBE) and the like, or indeed any process where a reflectometry and/or pyromtery technique is required to assess the characteristics of a substance within a reaction chamber when the conditions within that reaction chamber during the growth of, or other chemical or physical alteration to, the substance are such that conventional measurement techniques are impossible.

In modern semiconductor wafer growth, particularly where the wafer comprises multiple layers of different semiconductor materials, it is important to carefully monitor conditions and characteristics of the substrate at all times to achieve an acceptable degree of uniformity across all the wafers that may be grown during a particular process run, or in successive process runs. Specifically, the resulting characteristics of a wafer are highly dependent on the reaction conditions, particularly temperature and pressure, during growth, and currently, wafer growth of this type requires exceedingly skilled technicians to monitor the process and often make instinctive judgements as to whether certain process parameters should be changed in order to obtain wafers of the highest quality and uniformity. A real-time analysis of reflectance data and automatic control of the semiconductor growth process would thus be of great advantage.

One real-time semiconductor property characterization method in current use is known as reflection high electron energy deflection (RHEED), and this method is widely used in molecular beam epitaxy (MBE) to control two-dimensional growth, growth rates and composition of ternary layers. However, CVD and other techniques do not involve high vacuum conditions required for the use of electrons and therefore RHEED cannot be applied.

In gas phase epitaxy (GPE) processes, or other semiconductor layering, deposition and growth techniques which are conducted in aggressive environments, in-situ reflectometry can provide similar access to the growth process.

The most common methods of growing GaN and like semiconductors is a process known as Gas Phase Epitaxy (GPE) or MOVPE, and such process is most commonly carried out using a piece of apparatus known as a reactor. Such reactors are manufactured by companies like Aixtron, Veeco, and EMF Limited. A specific example of a reactor, and one which is currently popular in the industry is an Aixtron AIX 200 RF. Essentially, the reactor is a horizontally orientated cylindrical chamber through which gas vapour is allowed to flow and which is radio-frequency heated and comprises a water cooled quartz reaction chamber operated at low pressure. Typically, Trimethylgallium (TMGa), Trimethylindium (TMIn), Trimethylaluminum (TMAl) and ammonia are used as group III and group V precursors respectively and these are caused to pass over a substrate material, which is commonly sapphire ($Al2O3$).

Referring firstly to FIG. 1 provided herewith, the MOVPE system was equipped with a commercially available reflectometer schematically indicated at 2 consisting of a white light source 4 and a CCD spectrometer 6 (Filmetrics F 30). The spectrometer is a 512-element photodiode array with a spectral range of 400 nm- 1100 nm and a resolution of 2 nm. The spectrometer is controlled by a computer 8 and the spectrometer software allows calculation of semiconductor physical characteristics such as deposition rate, the refractive index n, the extinction coefficient k and reflectivity R. For these purposes, material data libraries are contained in the software.

As will be appreciated from FIG. 1, an optical access to the substrate with the nitride layer growing thereon in the MOVPE reactor is mandatory.

Accordingly, the reactor 10 comprises a liner tube 12 made of quartz glass. To the outside of the reactor, there is provided a water-cooled jacket 14, and to the outside of said jacket there is provided a radio-frequency heating coil 16 which acts to direct high intensity RF energy onto a susceptor 18 on top of which is positioned a substrate 20 which is most commonly made of sapphire. During use, a source of mixed metal organic gases passes into the chamber through an inlet 22 and as a result of the controlled conditions within the reactor and the composition of the inlet gas, semiconductor material begins firstly to nucleate on the substrate, and subsequently grow thereon. A source of purging gas is also provided which flows around the liner tube and whose flow ultimately aids in the expulsion of the metal organic gas stream from the reactor in general. It is to be understood that the nature of the gaseous flows used in such reactors is often exceptionally toxic to humans, and that great care must be taken in how such gases are handled.

In use, due to the horizontal configuration of the reactor, the ceiling of the liner gets coated with Nitride or other elemental/molecular deposits during semiconductor growth, rendering it opaque to at least some extent. Therefore, a 5 mm diameter hole is drilled in the liner ceiling. The liner is located inside a quartz cylinder (outer reactor tube), which is surrounded by the water cooling jacket made of quartz, too. The reflectometer is mounted directly above the zenith of the usually cylindrical liner in which the hole is drilled so that, except for variations in the surface profile of the semiconductor, light incident thereon from the reflectometer is reflected directly back towards the source of the light as generally indicated at 26. Both the incident and reflected light has to pass through all the quartz walls and the cooling water. Disturbing reflections from the quartz walls can be eliminated by reference measurements as in generally the oscillatory characteristics of the quartz is not affected by reaction conditions.

The spectrometer and the light source are connected to the lens system 28 by optical fibers of a coaxial type, outer strands of which are intended to carry reflected light back to the spectrometer, and the inner strands of which are intended to carry white light from the white light source of the reflectometer. The reflectance of the sample surface, recorded during the growth process, is continuously monitored and recorded. After loading the substrate into the reactor, substrates are typically heated up to 950° C. under a steady flow of a nitrogen/hydrogen mixture. Following this sapphire surface cleaning step, the substrate temperature is lowered to 520° C. for the deposition of the low temperature nucleation layer. After the nucleation layer is deposited, reactor temperature is increased to 1050° C. for growth of undoped bulk GaN.

Reflectance profiles obtained with the above mentioned setup from MOVPE GaN growth processes on sapphire are shown in FIG. 2. The two curves were recorded during GaN growth on sapphire substrates with slightly different polishing delivered from different manufacturers. The deposition of the nucleation layer causes the first increase in reflectivity. During the following annealing step, while the polycrystalline nucleation layer is partially crystallizing, the reflection increases slightly and then drops. At this point the main GaN layer growth is started, revealing small oscillations with increasing amplitude due to decreasing surface roughness. In spite of the fact, that all growth parameters were kept constant, in the initial stages of GaN growth, the course of oscillations amplitudes in the two curves is totally different. While in the upper curve, the maximum amplitude is reached after two oscillations, the lower curve reaches maximum after four oscillations. This confirms, that heteroepitaxial GaN growth processes are very sensitive against every small variation of sapphire substrate properties. Development of the surface morphology is indicated by the course of amplitudes in the reflectance spectrum. After a few oscillation periods, the growth conditions are stabilized. The shown oscillations of the GaN growth correspond to a growth rate of 2 μm/hr. The thickness of the GaN which is grown during one oscillation can be approximately calculated using the following equation:

$$D_{GaN}[nm] = \lambda_m/2n$$

where $\lambda_m$ is the measuring wavelength of the spectrometer in nm and n is the refractive index of GaN at the measuring wavelength. The oscillations are resonances of the layer system, where the resonator is formed by the GaN layer and the refractive index steps of the transitions GaN/sapphire and GaN/gas phase, respectively. In FIG. 2, one oscillation corresponds to a GaN layer thickness of around 118 nm, according to the above equation. The refractive index of GaN at the spectrometer wavelength of 580 nm is 2.45 and does not change much with temperature. Thus the values for thickness calculated during growth (hot substrate) agree well with data measured at room temperature using Scanning Electron Microscopy (SEM).

During ternary layer growth (InGaN, AlGaN), prereactions in the reactor between the different group III molecules and ammonia can occur, strongly affecting growth rates and composition. The intensity of the prereactions is dependent on pressure and temperature in the reactor during growth and the type and amount of group III molecules (e. g. TMGa, TEGa, TMAl). In-situ reflectometry provides direct information on any change of growth parameters (pressure, temperature, fluxes) affecting either growth rate (change of oscillation width) and/or surface roughness (change of oscillation amplitude).

Other technical articles, specifically one mentioning one of the inventors herefor, namely that published in the Journal of Crystal Growth 248 (2003) 533-536, clearly demonstrate the strong interaction between growth conditions, the substrate surface preparation, and the physical properties of GaN epilayers.

It is also to be noted that other characterisation methods for determining physical properties of semiconductors are available, such as transmission or scanning electron microscopy (T/SEM), high resolution X-ray diffraction (HR-XRD), photoluminescence (PL) and capacitance-voltage (C-V), but such are not suited or indeed impossible to conduct in real-time during the semi-conductor growth process due to the aggressive ambient conditions within the reactor.

While the apparatus described above is generally satisfactory for semiconductor growing techniques which are not conducted under low pressures, it is generally unsuitable for the growing of semiconductors at low pressures, e.g. 10-7-10-10 bar as mentioned above, as the low pressures cannot be maintained.

Where such low pressures are required, generally a mechanically controlled shutter (not shown in FIG. 1) may be provided immediately over the hole in upper reaches of the reaction chamber, and on its external surface. The arrangement is such that the shutter is programmed to open at predetermined intervals to enable the measurement of the semiconductor surface characteristics during growth intermittently. In practice, the system may either be programmed to be suspended during the periods that the shutter is closed over the hole in the reaction chamber, such that there is no illumination provided to the external surface of the shutter when closed, and the system is only illuminated when the shutter is opened. Alternatively, the system may be in a state of permanent illumination, and the PC 8 receives data throughout the periods when the shutter is both closed and open, suitable software algorithms being employed to eliminate the redundant data which is received by the PC when the shutter is closed.

In any event, while the above system produces adequate data characterising the growth of semiconductors, it takes no account of the fact that in certain MBE reactors, the substrate, and thus the semiconductor wafer growing thereon during the process is rotating, often at speeds of between 6-12 rpm (revolutions per minute). In the interests of completeness, the substrate is commonly rotated to eliminate to mitigate against the possibility of uneven wafer thickness during growth which can occur as a result of the fact that the semiconductor elements or molecules typically flow through the reaction chamber uniformly and consistently throughout the growing process in only a single direction.

This additional movement of the semiconductor wafer introduces yet further complexity and variation in the measurements obtained through reflectometry in the manner already described. In practice, it is generally impossible to achieve perfectly uniform and planar rotation of the substrate, just as it is impossible to provide a perfectly planar substrate surface on which semiconductor growth can occur. It should be borne in mind that the initial thicknesses of the semiconductor wafers as they are grown on the subtrates can be of the order of only a few Angstroms or picometers (10-10-10-9 m).

Accordingly, the substrate, and thus the semiconductor wafer growing thereon will precess to a certain degree, again giving rise to inconsistent and error-prone measurements.

It is an object of the following invention to provide an improved means for real-time monitoring of semiconductor characteristics during growth which overcomes the above problems, and provides improved data for analysis.

BRIEF SUMMARY OF THE DISCLOSURE

According to the invention there is provided a reflectometery technique for gathering meaningful reflectance data indicative of one or more characteristics of a substance being grown within a reaction chamber at the time of measurement, said substance being grown on a substrate which is periodically rotated about an axis substantially normal to the growing plane within said reaction chamber to ensure uniform deposition of said substance thereon, said technique including the steps of directing light from a light source of known characteristics into said reaction chamber towards the surface of the substance being grown therein, and collecting the light reflecting from said surface at a detector whereat the received light is converted into electrical signals which are subsequently subjected to computer processing, said reaction chamber being provided with operable shutter means disposed between an opening in said reaction chamber and said light source to permit light through said shutter and opening when said shutter is open but preventing such when closed, the technique being characterised by the synchronising of the opening of the shutter with the speed of revolution of the substrate such that the same discrete area of substance growing on said substrate is consistently illuminated, data being substantially instantaneously captured at the moment of opening of said shutter thus eliminating any errors due to precession of the substrate.

Preferably, the substrate is rotated continuously and further preferably with substantially uniform angular velocity.

It is to be understood by the reader that in the above, the fact that further substance growth will occur on the particular area of substrate illuminated is not important to the measurement—it is the growth characteristics which are important, and illumination of the same area consistently during substance growth will provide a good indication of the manner in which the substance is growing.

In a preferred embodiment, the light source is illuminated in synchronicity with the opening of the shutter, as is the data capture.

In an alternative embodiment, the light source is permanently illuminated, and the data capture occurs continuously, correcting being made in software for redundant data recording during the periods when the shutter is closed.

According to a second aspect of the invention there is provided reflectometry apparatus for gathering meaningful reflectance data indicative of one or more characteristics of a substance being grown within a reaction chamber in real time during growth, said apparatus including a light source disposed to the outside of said reaction chamber which includes a substantially horizontal substrate on which the substance growth occurs, and a detector being capable of converting light into electrical signals which are subsequently subjected to computer processing, the light source and detector being arranged in suitable locations with regard to the substrate such that light impinging on the substrate from the source is substantially reflected directly towards the detector, said substrate being periodically rotated about an axis substantially normal to the growing plane within said reaction chamber to ensure uniform deposition of said substance thereon, said reaction chamber being provided with operable shutter means disposed between an opening in said reaction chamber and said light source to permit light through said shutter and opening when said shutter is open but preventing such when closed, characterised in that the shutter is caused to open in synchronicity with the speed of revolution of the substrate such that substantially the same discrete area of the substance growing on the substrate is illuminated so as to eliminate the effects of precession on the measurements.

The reaction chamber is one in which semiconductor material is most expediently grown on the substrate, which is preferably of a sapphire material. However, any suitable substrate material may be used, such as materials chosen from the following non-exclusive examples: silicon, germanium, sapphire silicon carbide, glass, gallium arsenide.

In a most preferred embodiment, the detector apparatus is an EpiEYE™ device available from the applicants herefor.

In a most preferred arrangement, the detector is triggerable and triggered to collect data in synchronicity with both the illumination of the substrate and the opening of the shutter.

The applicants herefor found that the implementation of the method described above resulted in markedly enhanced, accurate and usable data sets as compared to random illumination of the rotating substrate wherein various different areas of the substrate were consecutively illuminated.

A specific embodiment of the invention will now be provided by way of example with reference to the following drawings wherein:

DETAILED DESCRIPTION

Figure 1:
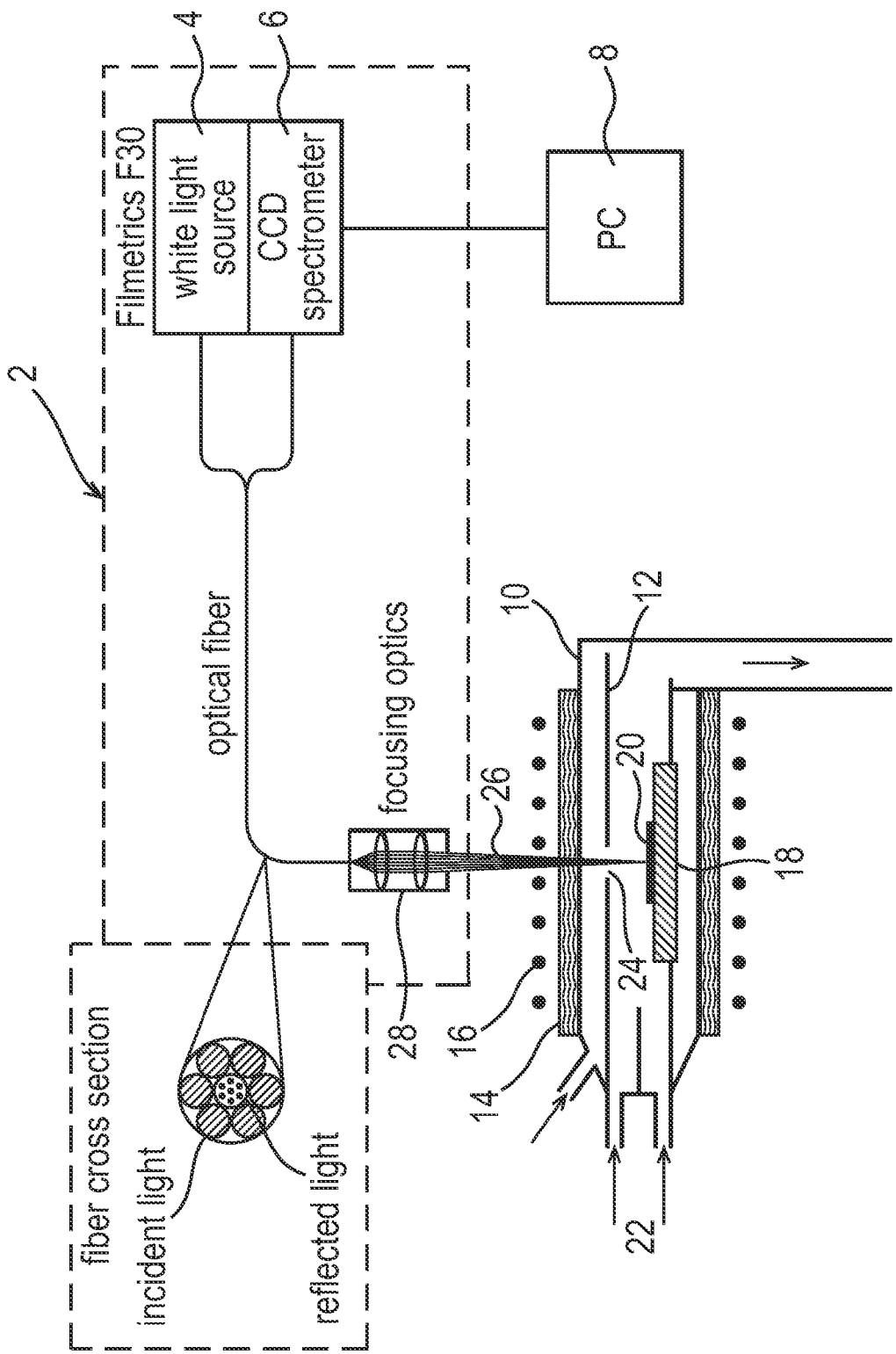
FIG. 1 shows a schematic representation of the prior art, in particular of an Aixtron AIX 200 RF horizontal MOVPE reactor.
Figure 2:
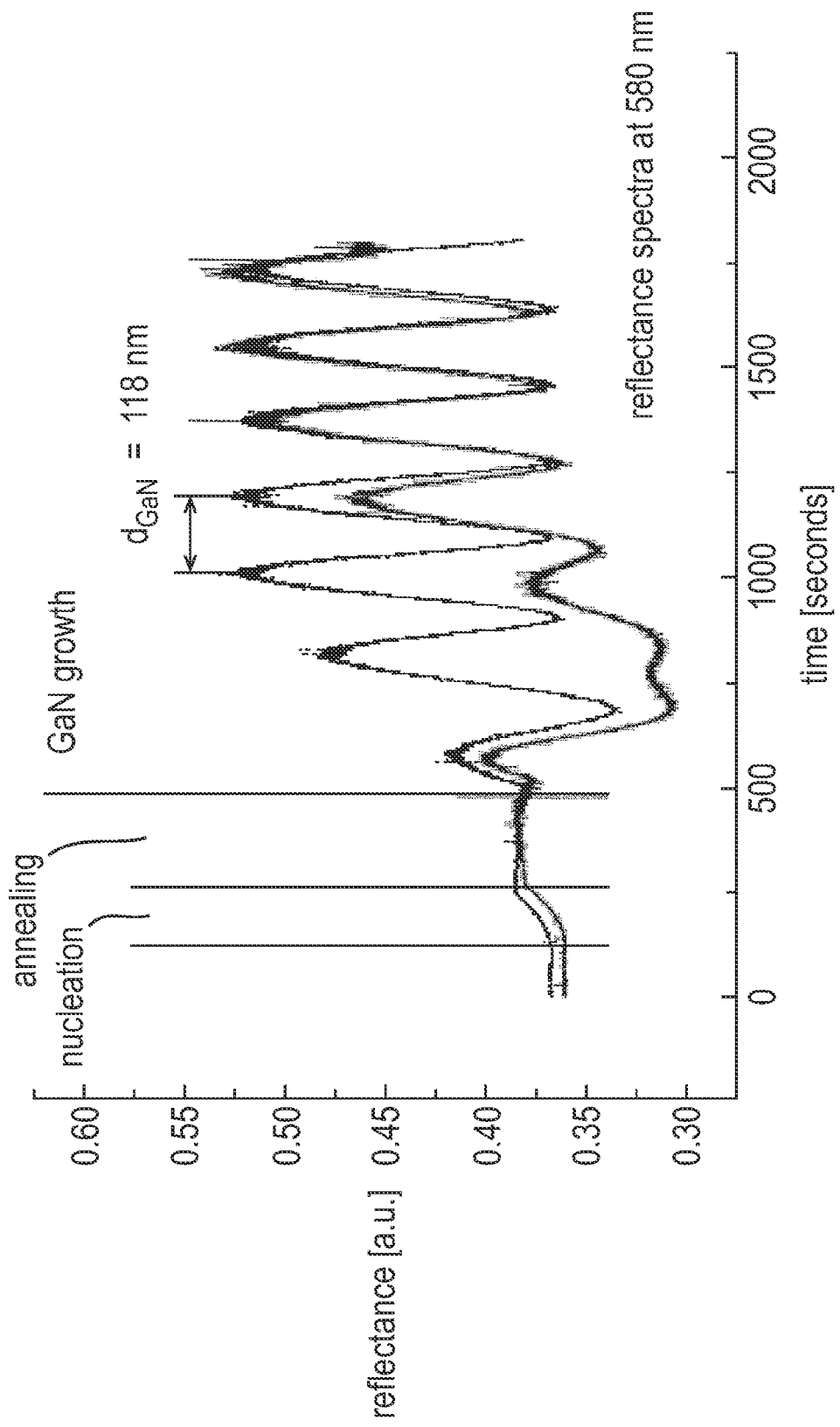
FIG. 2 shows a graph of in-situ reflectance interferogram obtained during MOVPE growth of GaN—the two curves represent different sapphire substrates and therefore indicate strong differences in the initial stages of growth.
Figure 2A:
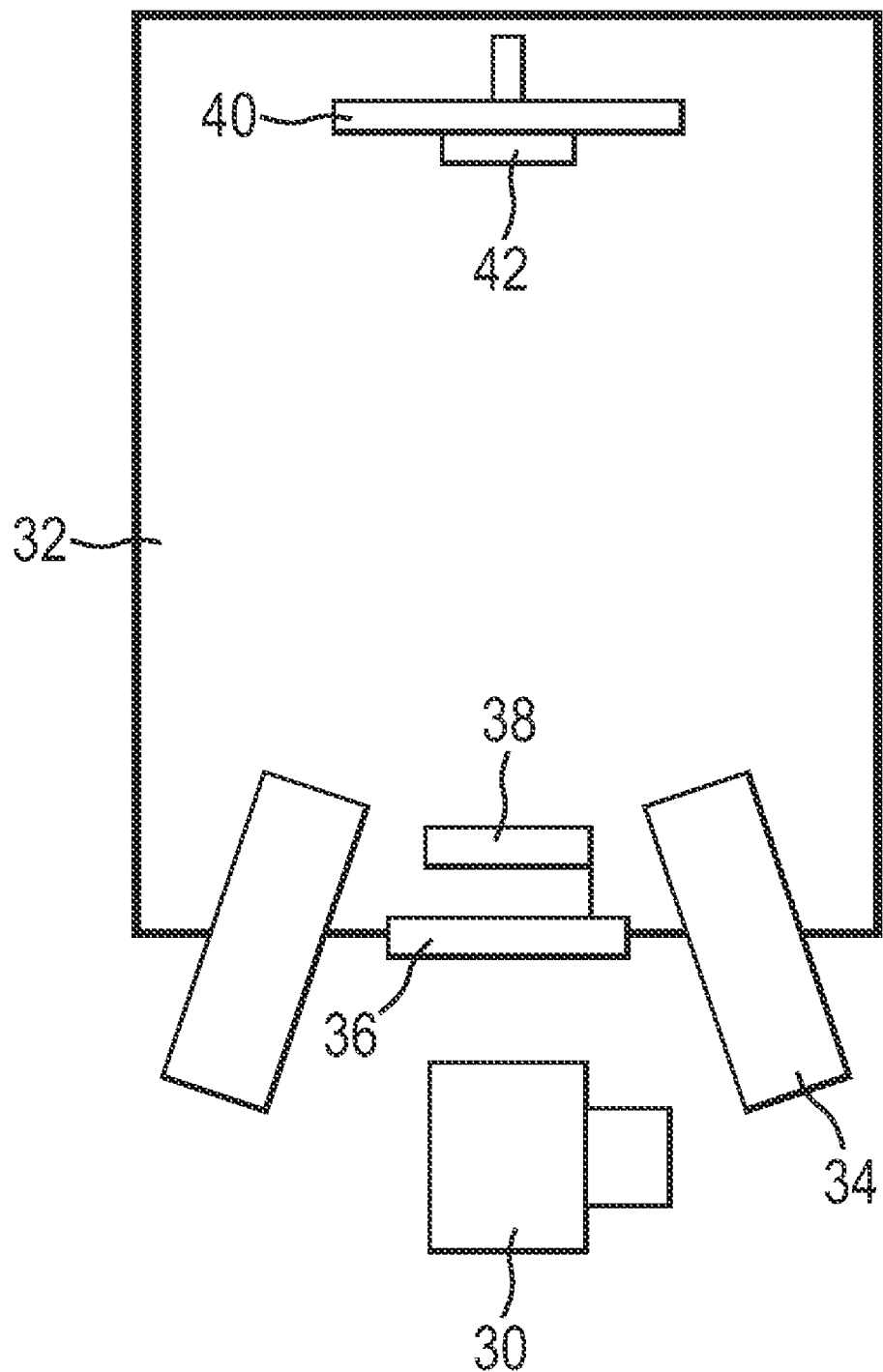
FIG. 2A shows a schematic representation of an arrangement of apparatus suitable for use in carrying out the present invention.

Referring firstly to FIG. 2A, apparatus suitable for carrying out the present invention may be suitably arranged as shown. Such apparatus consists of an EpiEYE reflectometer 30 (available from the applicant herefor), a reaction chamber 32 or vacuum chamber complete with evaporation or sputtered sources 34 such as Knudsen cells, an optical view-port 36, a window shutter 38, a susceptor 40 which is typically heated and can rotate, and affixed to the susceptor 40, one or more suitable substrates 42.

Figure 3:
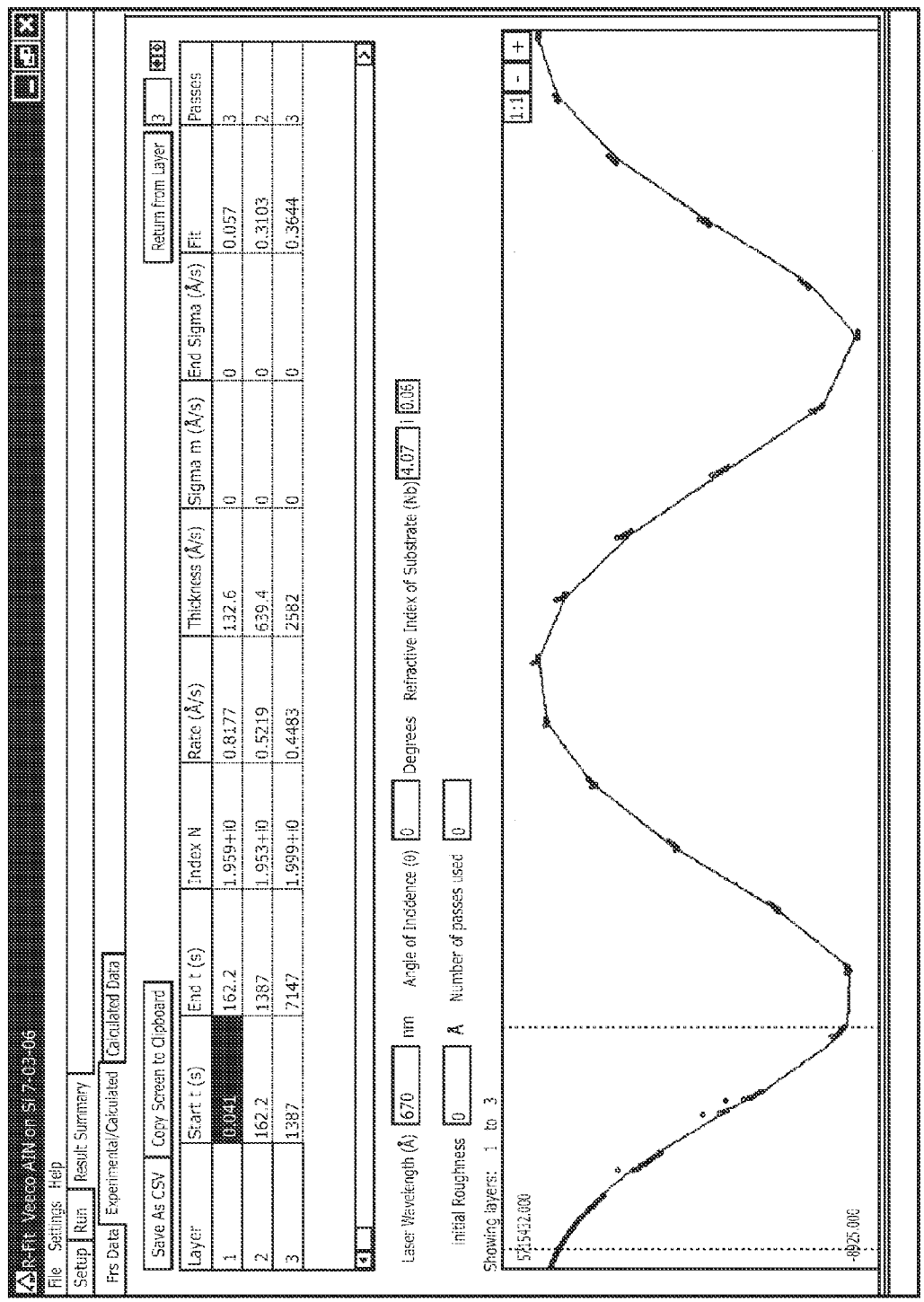
FIG. 3 shows a graph of the approximate fit achieved from monitoring the growth of AlN on Si(100) at 850° C. when the shutter is opened only relatively infrequently and not in synchronicity with the substrate rotation periodicity.

Referring to FIG. 3, it can be seen that, as there are large portions of data missing (indicating the times when the shutter is closed and data is not being acquired by the system), an approximation has to be made so that a suitable function can be achieved and refractive index of the substance on the substrate can be calculated.

Figure 4:
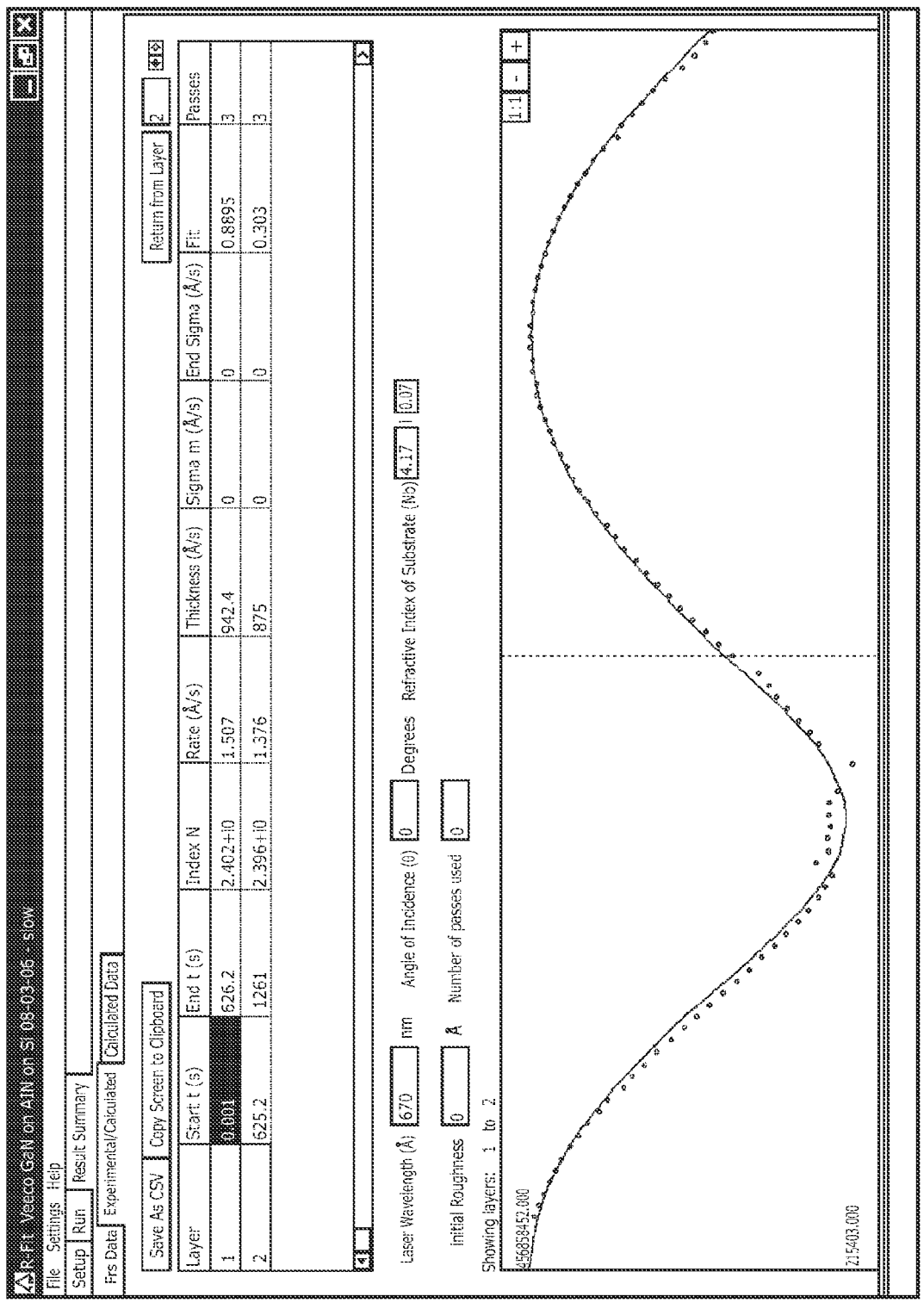
FIG. 4 shows a graph demonstrating data acquisition when the rate of data capture is in synchronicity with the periodicity of the substrate rotation.

In FIG. 4, there are many more data points, and at more regular intervals. In the graph shown in FIG. 4, the detector device is triggered to collect data at the same time as the opening of the shutter, and this also occurs in synchronicity with the periodicity of the rotation of the substrate. Specifically, the shutter is caused to open for 1 second in every 6 seconds, with the substrate being rotated at 10 rpm. Accordingly, the detector records one data point for every rotation of the substrate.

It is worth mentioning that the substrate may have associated therewith a susceptor which is caused to become hot by virtue of electromagnetic radiation extant within the reaction chamber. Both susceptor and substrate may be integrated in a single unit which is then caused to rotate within the reaction chamber.

In practice, the EpiEYE detector is specifically actuated by an electronic trigger generated by the rotation of the susceptor; the detector thus records one data point for every rotation of the substrate. The shutter (which may be electronically controlled) is then set to open for one second per rotation. The detector is then used to "search" for the moment when the shutter is open; in this manner, the detector is thus synchronised with the shutter and with the substrate rotation. The results can be clearly seen in FIG. 4.

The invention claimed is:

1. Reflectometry apparatus for gathering meaningful reflectance data indicative of one or more characteristics of a substance being grown within a reaction chamber in real time during growth, said apparatus including a light source disposed to the outside of the reaction chamber which includes a substantially horizontal substrate on which the substance growth occurs, and a detector being capable of converting light into electrical signals which are subsequently subjected to computer processing, said light source and detector being arranged in suitable locations with regard to the substrate such that light entering an opening in the reaction chamber and impinging on the substrate from said source is substantially reflected back through the opening and directly towards said detector, the substrate being periodically rotated about an axis substantially normal to the growing plane within the reaction chamber to ensure uniform deposition of the substance thereon, said apparatus being provided with a shutter arranged to permit light through said shutter when said shutter is open but preventing such when closed, characterized in that said shutter is caused to open in synchronicity with the speed of revolution of the substrate such that substantially the same discrete area of the substance growing on the substrate is illuminated so as to eliminate the effects of precession on the measurements.

2. Apparatus according to claim 1 wherein said shutter is disposed between the substrate and the opening in the reaction chamber.

3. Apparatus according to claim 1 wherein said detector is triggerable and triggered to collect data in synchronicity with both the illumination of the substrate and the opening of said shutter.

4. Apparatus according to claim 1 further comprising the reaction chamber in combination with said apparatus.

5. A reflectometry method for gathering meaningful reflectance data indicative of one or more characteristics of a substance being grown within a reaction chamber at the time of measurement, the substance being grown on a substrate which is periodically rotated about an axis substantially normal to the growing plane within the reaction chamber to ensure uniform deposition of the substance thereon, said method including the steps of directing light from a light source of known characteristics into the reaction chamber towards the surface of the substance being grown therein, and collecting the light reflecting from the surface at a detector whereat the received light is converted into electrical signals which are subsequently subjected to computer processing, the reaction chamber being provided with a shutter arranged to permit light through the shutter when the shutter is open but preventing such when closed, said method being characterized by the synchronizing of the opening of the shutter with the speed of revolution of the substrate such that the same discrete area of substance growing on the substrate is consistently illuminated, data being substantially instantaneously captured at the moment of opening of the shutter thus eliminating any errors due to precession of the substrate.

6. The method of claim 5 wherein the light source is illuminated in synchronicity with the opening of the shutter, as is the data capture.

7. The method of claim 5 wherein the light source is permanently illuminated, and the data capture occurs continuously.

8. The method of claim 7 wherein correction is made in software for redundant data recording during the periods when the shutter is closed.

9. The method of claim 5 wherein the shutter is disposed between the substrate and an opening in the reaction chamber.

10. The method of claim 5 wherein the substrate material is chosen from one of the following materials: sapphire, silicon, germanium, sapphire silicon carbide, glass, gallium arsenide.

* * * * *